United States Patent [19]

George

[11] Patent Number: 4,823,399

[45] Date of Patent: Apr. 18, 1989

[54] REFINED TUNING OF RF RECEIVER WITH FREQUENCY-LOCKED LOOP

[75] Inventor: Ashok K. George, San Diego, Calif.

[73] Assignee: General Instrument Corporation, New York, N.Y.

[21] Appl. No.: 80,412

[22] Filed: Jul. 30, 1987

[51] Int. Cl.[4] .......................... H03D 7/16; H03J 7/04; H04N 5/50

[52] U.S. Cl. ..................................... 455/192; 455/209; 455/260; 455/316; 331/22; 331/41; 358/195.1

[58] Field of Search ................................. 455/314–316, 455/182–185, 192, 164, 165, 260, 264, 206–209; 331/22, 2, 40, 41; 329/50; 358/191, 195.1

[56] References Cited

U.S. PATENT DOCUMENTS

| | | | |
|---|---|---|---|
| 4,163,259 | 7/1979 | Skerlos | 358/195.1 X |
| 4,298,988 | 11/1981 | Dages | 455/182 |
| 4,306,310 | 12/1981 | Malinowski et al. | 455/192 |
| 4,575,761 | 3/1986 | Carlson et al. | 455/316 X |
| 4,658,438 | 4/1987 | Kamata et al. | 455/208 X |
| 4,709,408 | 11/1987 | Itakura et al. | 455/260 |

*Primary Examiner*—Thomas H. Tarcza
*Assistant Examiner*—Giberto Barrón, Jr.
*Attorney, Agent, or Firm*—Edward W. Callan

[57] ABSTRACT

In an RF receiver having a phase-locked loop demodulator and FLL tuning in its RF converter, the frequency of the VCO output signal in the phase-locked loop (PLL) demodulator is controlled indirectly by the FLL in the RF converter in response to a measurement of the VCO output signal in the phase-locked loop demodulator and comparison of such measured signal to a predetermined intermediated frequency. A microcomputer performs a refined FLL tuning algorithm to tune a selected RF carrier input signal and audio subcarrier input signals. The algorithm provides a means of assuring that the PLL demodulator is responding to an input signal derived from a carrier signal of a selected input frequency without having to use hardware to detect the presence of a carrier signal.

10 Claims, 2 Drawing Sheets

REFINED TUNING OF RF RECEIVER WITH FREQUENCY-LOCKED LOOP

BACKGROUND OF THE INVENTION

The present invention generally pertains to frequency tuning in a receiver of an RF communications system and is particularly directed to refined tuning of an RF receiver using frequency-locked loop (FLL) tuning.

FLL tuning is increasingly being used for frequency synthesis/tuning. TV converters, for instance, use frequency-locked loops for converting the RF frequencies of received television signals to the frequency of Channel 3 or 4. FLL tuning includes the steps of measuring the frequency of a voltage-controlled oscillator (VCO) output signal, comparing it with a predetermined reference frequency value, and varying the control voltage of the VCO to correct the VCO output signal frequency.

In the RF converter of a typical RF receiver using FLL, a first VCO output signal at a frequency $f_1$ is mixed with a received input signal at a frequency $f_{IN}$ to provide the input signal at an intermediate frequency $f_{IF}$. The input signal at the intermediate frequency $f_{IN}$ subsequently is processed by a phase-locked loop (PLL) demodulator, in which the input signal at the intermediate frequency $f_{IF}$ is mixed with the output signal from a second VCO at a frequency $f_2$ to provide an input signal at a baseband frequency $f_{BB}$. The second VCO tracks the phase of the input signal at the intermediate frequency $f_{IF}$ and is controlled by a phase error signal $e_p$ derived from the input signal at the baseband frequency $f_{BB}$. The frequency $f_1$ of the first VCO output signal is maintained by a frequency-locked loop in which the frequency $f_1$ of the first VCO output signal is compared with a predetermined nominal frequency $f_n$ that is the sum or difference of a selected input carrier frequency $f_{IN}$ and a predetermined intermediate frequency $f_{IF}$. An error signal $e_1$ provided as a result of such comparison is used to control the frequency $f_1$ of the first VCO output signal.

If there is any frequency drift in the input signal received by the RF converter, the intermediate frequency of the input signal provided to the phase-locked loop demodulator is offset by such frequency drift. Since the output signal from the second VCO is phase locked to the input signal provided to the phase-locked loop demodulator, the frequency of the output signal from the second VCO is also offset by such frequency drift.

SUMMARY OF THE INVENTION

The present invention provides a system for fine tuning of an RF receiver of the type described above having a phase-locked loop demodulator and FLL tuning in its RF converter, wherein the frequency of the second VCO output signal in the phase-locked loop demodulator is controlled indirectly by the FLL in the RF converter in response to a measurement of the second VCO output signal in the phase-locked loop demodulator.

The frequency tuning system of the present invention includes a first voltage-controlled oscillator (VCO) for providing an output signal at a predetermined nominal frequency $f_n$ that is the sum or difference of a selected input carrier frequency and a predetermined intermediate frequency; first means for mixing an input signal at the selected input carrier frequency with the output signal from the first VCO to provide said input signal at the predetermined intermediate frequency; a second VCO for providing an output signal at the intermediate frequency; second means for mixing said input signal at the intermediate frequency with the output signal from the second VCO to provide said input signal at a baseband frequency; means responsive to said input signal provided by the second mixing means for causing the second VCO to provide its output signal at the frequency of the input signal to the second mixing means; means for measuring the frequency of the output signal from the second VCO; means for comparing the measured frequency of the output signal from the second VCO with the predetermined intermediate frequency; and means for tuning the first VCO in response to said comparison of the measured frequency of the output signal from the second VCO with the predetermined intermediate frequency to maintain the input signal to the second mixing means at the predetermined intermediate frequency. The measurement, comparison and tuning functions are accomplished by a refined-tuning algorithm performed by a microcomputer.

This scheme will work if there is an input signal to the phase-locked second mixing means present all the the time and if the second VCO stays locked to such input signal all the time. If there is no input signal to the second mixing means, or if such an input signal disappears temporarily, the second VCO will no longer be locked to an input signal at the intermediate frequency and will operate as a free running oscillator. The microcomputer has no means of knowing whether the second VCO is in lock or not and may keep on correcting the frequency of the first VCO output signal to correct the frequency of the input signal to second mixing means, and the tuning system will fail.

One way to avoid this type of failure is to monitor a carrier-detect signal. The microcomputer would monitor the carrier-detect signal and would attempt to fine tune the second VCO only if the carrier-detect signal was active. This technique would work, provided there is a reliable carrier-detect signal. Generating a carrier-detect signal requires some hardware and quite often the signal would not be reliable. The present invention utilizes a refined-tuning algorithm that eliminates the need for hardware to generate a carrier-detect signal.

The present invention also provides a flexible and highly cost effective system for refined tuning of selected input carrier frequency signals and FLL tuning of the audio subcarriers. In such a system, a single microcomputer is used to tune the selected input carrier frequency input signal and the audio subcarrier frequency signals.

Additional features of the present invention are described in relation to the description of the preferred embodiments.

DESCRIPTION OF THE PREFERRED EMBODIMENTS

Figure 1:
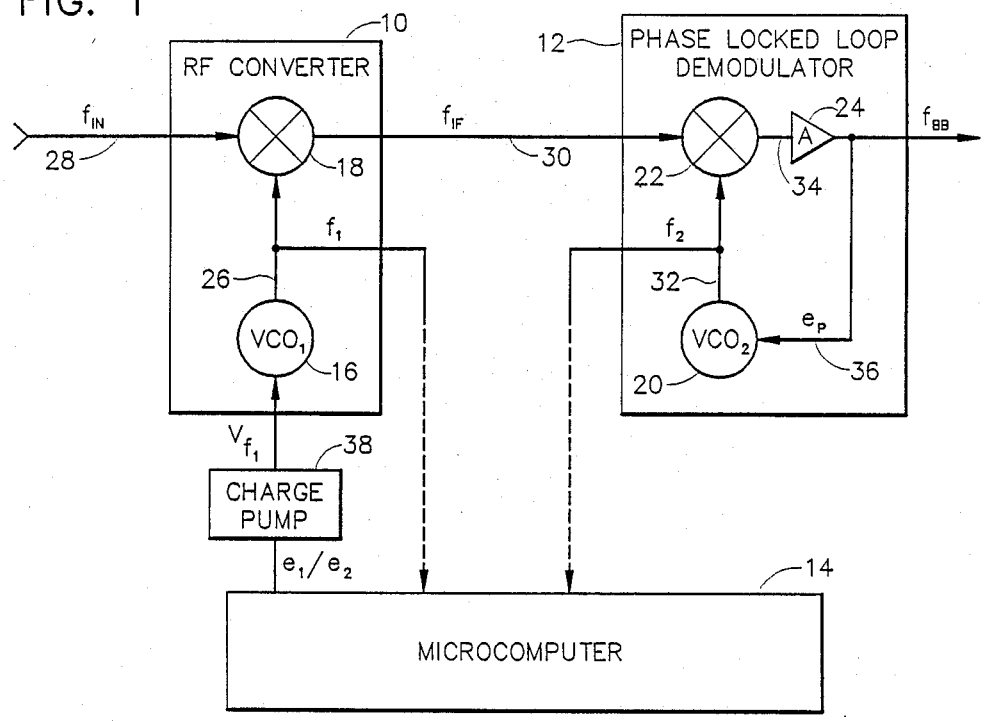
FIG. 1 is a diagram of the system of the present invention.

Referring to FIG. 1, a preferred embodiment of the system of the present invention includes an RF converter 10, a phase-locked loop demodulator 12 and a microcomputer 14. The RF converter 10 includes a first voltage-controlled oscillator (VCO$_1$) 16 and a first mixer 18. The phase-locked loop demodulator 12 includes a second voltage-controlled oscillator (VCO$_2$) 20, a second mixer 22 and an amplifier 24.

The first VCO 16 provides an output signal on line 26 at a first frequency $f_1$ that is maintained by FLL tuning at a predetermined nominal frequency $f_n$ that is the sum or difference of a selected input carrier signal frequency $f_{IN}$ and a predetermined intermediate frequency $f_{IF}$.

The first mixer 18 mixes a carrier input signal on line 28 at the selected input carrier signal frequency $f_{IN}$ with the output signal on line 26 from the first VCO 16 to provide said input signal on line 30 at the predetermined intermediate frequency.

The second VCO 20 provides an output signal on line 32 at a second frequency $f_2$ that is maintained at the intermediate frequency $f_{IF}$.

The second mixer 22 mixes the input signal on line 30 at the predetermined intermediate frequency $f_{IF}$ with the output signal on line 32 from the second VCO 20 to provide the input signal on line 34 at a baseband frequency $f_{BB}$.

In the phase-locked loop, the amplifier 24 amplifies and filters the input signal on line 34 at the baseband frequency $f_{BB}$ to produce a phase error signal $e_p$ on line 36 that causes the second VCO 20 to track the phase of the input signal on line 30 at the intermediate frequency $f_{IF}$. Thus the second VCO 20 provides its output signal on line 32 at a second frequency $f_2$ that tracks the input signal on line 30 in response to the output signal on line 34 from the second mixer 22.

The frequency of the output signal from the first VCO 16 is controlled in response to a voltage signal $V_{f1}$ provided by a charge pump 38.

Figure 2:
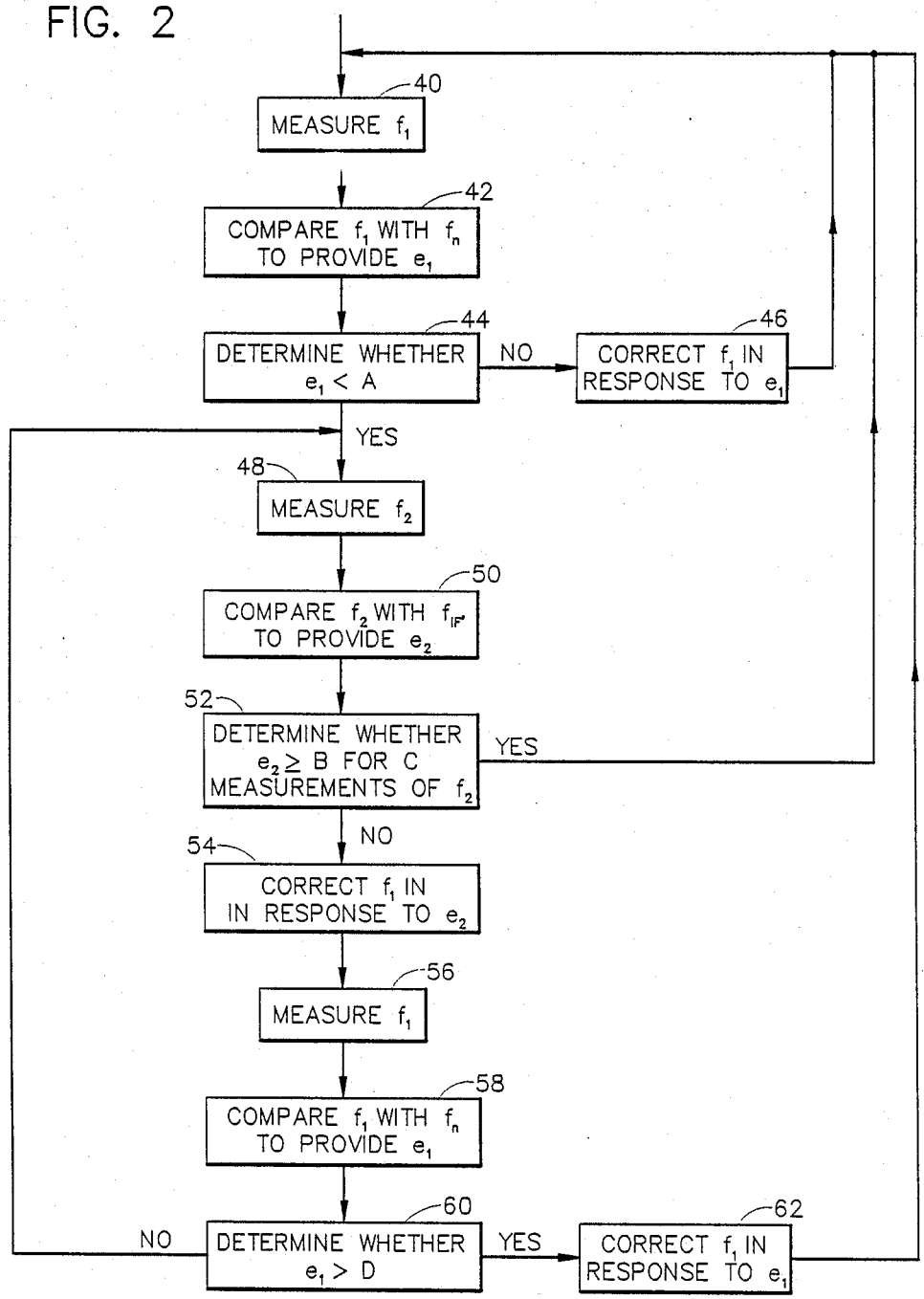
FIG. 2 is a diagram of processing routines performed by the microcomputer in the system of FIG. 1.

The microcomputer 14 accomplishes fine tuning of the system by performing the processing routines shown in FIG. 2. Initially, the microcomputer 14 performs a routine 40 of measuring the frequency $f_1$ of the output signal on line 26 from the first VCO 16.

The microcomputer 14 then performs a routine 42 of comparing the measured frequency $f_1$ with the predetermined nominal frequency $f_n$ to provide a first error signal $e_1$. The value of the predetermined nominal frequency $f_n$ is stored in the microcomputer 14 before commencement of the processing routines described with reference to FIG. 2.

The microcomputer 14 then performs a routine 44 of determining whether the first error signal $e_1$ is less than a predetermined value "A" which represents a predetermined frequency difference "A" between the measured first frequency $f_1$ and the predetermined nominal frequency $f_n$. In a preferred embodiment wherein the input signal frequency $f_{IN}$ is in either the C-band frequency range or the Ku-band frequency range, and the intermediate frequency $f_{IF}$ is 612 MHz., the predetermined value "A" represents a predetermined frequency difference of 500 KHz. The value of "A" is stored in the microcomputer 14 before commencement of the processing routines described with reference to FIG. 2.

If the microcomputer 14 determines that the first error signal $e_1$ is not less than the predetermined value "A", the microcomputer performs a routine 46 of correcting the frequency $f_1$ of the output signal on line 26 from the first VCO 16 by increasing or decreasing the voltage $V_{f1}$ from the charge pump 38 to the first VCO 16 in response to the first error signal $e_1$ derived from the comparison of the measured first frequency $f_1$ with the predetermined nominal frequency $f_n$. This process of performing routines 40, 42, 44 and 46 is repeated until the microcomputer 14 determines that the first error signal $e_1$ is less than the predetermined value "A".

When the microcomputer 14 determines that the first error signal $e_1$ is less than the predetermined value "A", the microcomputer performs a routine 48 of measuring the frequency $f_2$ of the output signal on line 32 from the second VCO 20. The sampling time for measuring the frequency $f_2$ of the output signal from the second VCO 20 is kept almost equal to the dispersion rate of the input carrier signal on line 28 so that there is no measurement error due to frequency dispersion.

The microcomputer 14 then performs a routine 50 of comparing the measured frequency $f_2$ with the predetermined intermediate frequency $f_{IF}$ to provide a second error signal $e_2$. The value of the predetermined intermediate frequency $f_{IF}'$ is stored in the microcomputer 14 before commencement of the processing routines described with reference to FIG. 2.

The microcomputer 14 then performs a routine 52 of determining whether the second error signal $e_2$ is greater than or equal to a predetermined value "B" for a predetermined number "C" of consecutive measurements of the frequency $f_2$ of the output signal on line 32 from the second VCO 20. The predetermined value "B" represents a predetermined frequency difference between the measured second frequency $f_2$ and the predetermined intermediate frequency $f_{IF}$. In the aforementioned preferred embodiment wherein the input signal frequency $f_{IN}$ is in either the C-band frequency range or the Ku-band frequency range, and the intermediate frequency $f_{IF}$ is 612 MHz., the predetermined value "B" represents a predetermined frequency difference of 6 MHz, and the predetermined number "C" of consecutive measurements is ten. The 6 MHz. value allows for frequency drift in a low noise block converter, the error allowance in the correction of the first VCO output signal frequency $f_1$, and any deviation in the IF input signal on line 30. The values of "B" and "C" are stored in the microcomputer 14 before commencement of the processing routines described with reference to FIG. 2.

Satellite receivers normally operate in C-band or Ku-band. The lock range is selected so as not to be so great that receiver locking may occur in C-band due to terrestrial interference. Alternatively, the algorithm may provide different lock ranges for Ku-band and C-band; and the microcomputer 14 could be programmed to tune to C-band or Ku-band by sending an appropriate command to the microcomputer through a communication link. Thus the same tuning hardware could be used for C-band and Ku-band tuning.

If the microcomputer 14 determines that the second error signal $e_2$ is greater than or equal to the predetermined value "B" for a predetermined number "C" of consecutive measurements of the frequency $f_2$ of the output signal on line 32 from the second VCO 20, this means that the second VCO 20 is not locked to a signal at the predetermined intermediate frequency $f_{IF}$ or that there is a hardware problem; whereby correction of the frequency $f_2$ of the output signal on line 32 from the second VCO 20 by adjusting the frequency $f_1$ of the output signal on line 26 from the first VCO 16 is inhibited and the microcomputer 14 recommences the tuning process by again performing the first VCO output signal frequency $f_1$ measurement routine 40 described above.

When the microcomputer 14 determines that the second error signal $e_2$ is not greater than or equal to the predetermined value "B" for a predetermined number "C" of consecutive measurements of the frequency $f_2$ of the output signal on line 32 from the second VCO 20, the microcomputer 14 performs a routine 54 of correcting the frequency $f_2$ of the output signal on line 32 from the second VCO 20 by adjusting the frequency $f_1$ of the output signal on line 26 from the first VCO 16 by causing the charge pump 38 to provide a voltage signal $V_{f1}$ to the first VCO 16 in response to the second error signal $e_2$ derived from the comparison of the measured second frequency $f_2$ with the predetermined intermediate frequency $f_{IF}'$.

The microcomputer 14 tunes the first VCO 16 in response to said comparison of the measured frequency $f_2$ of the output signal on line 32 from the second VCO 20 with the predetermined intermediate frequency $f_{IF}'$ at a slower rate than in response to said comparison of the frequency $f_1$ of the output signal from the first VCO 16 with the predetermined nominal frequency $f_n$. This prevents sudden jumps in the first VCO output signal frequency $f_1$ and avoids perceptible disruptions in video. Also, the total error correction is limited to a low value even though the error may occasionally appear to be large due to deviation of the frequency of the carrier input signal on line 28.

So far the assumption has been that, if the second error signal $e_2$ is within acceptable limits the second VCO 20 is phase locked to the correct IF signal. This is not necessarily true. The second VCO 20 could be free running near the IF frequency, and subsequent adjustments of the frequency $f_1$ of the output signal from the first VCO 16 to fine tune the frequency $f_2$ of the second VCO 20 could have moved the frequency $f_1$ of the output signal of the first VCO 16 to the adjacent frequency channel. Carrier detection circuitry could be used to avoid this situation by fine tuning only when the carrier signal is detected as present. The refined-tuning algorithm performed by the microcomputer 14 eliminates the need for carrier detection by assigning limits to the frequency $f_1$ of the output signal from the first VCO 16. Accordingly, after adjustment of the frequency $f_1$ of the first VCO 16 output signal in response to the second error signal $e_2$ derived by comparing the measured second VCO output signal frequency $f_2$ with the predetermined intermediate frequency $f_{IF}$, performed in accordance with routine 54, the microprocessor next performs in sequence a routine 56 of measuring the frequency $f_1$ of the output signal on line 26 from the first VCO 16; a routine 58 of comparing the measured frequency $f_1$ with the predetermined nominal frequency $f_n$ to provide a first error signal $e_1$; and a routine 60 of determining whether the first error signal $e_1$ is greater than a predetermined value "D" which represents a predetermined frequency difference between the measured first frequency $f_1$ and the predetermined nominal frequency $f_n$. In the preferred embodiment described above, wherein the input signal frequency $f_{IN}$ is in either the C-band frequency range or the Ku-band frequency range, and the intermediate frequency $f_{IF}$ is 612 MHz., the predetermined value "D" represents a predetermined frequency difference of 8 MHz. The value of "D" is stored in the microcomputer 14 before commencement of the processing routines described with reference to FIG. 2.

If the microcomputer 14 determines that the first error signal $e_1$ is greater than the predetermined value "D", this means that the second VCO 20 is either free running or locked to an adjacent frequency channel, and in either event not responding to a second mixer 22 output signal on line 34 that is derived from an input signal on line 30 at the predetermined intermediate frequency $f_{IF}$; whereby the microcomputer 14 performs a routine 62 of correcting the frequency $f_1$ of the output signal on line 26 from the first VCO 16 by causing the charge pump 38 to generate a voltage signal $V_{f1}$ to control the first VCO 16 in response to the first error signal $e_1$ derived from the comparison of the measured first frequency $f_1$ with the predetermined nominal frequency $f_n$.

If the microcomputer 14 determines that the first error signal $e_1$ is not greater than the predetermined value "D", then the microcomputer again performs the sequence of routines 48, 50, 52 and 54 to make a refined tuning adjustment of the input signal on line 30 to the second mixer 22.

Thus by checking the first VCO 16 output signal frequency $f_1$ after every refined tuning adjustment made by sequentially performing routines 48, 50, 52 and 54, it is possible to determine whether the second VCO 20 is locked to the right signal. There is no need for any hardware to indicate the presence of a carrier.

Figure 3:
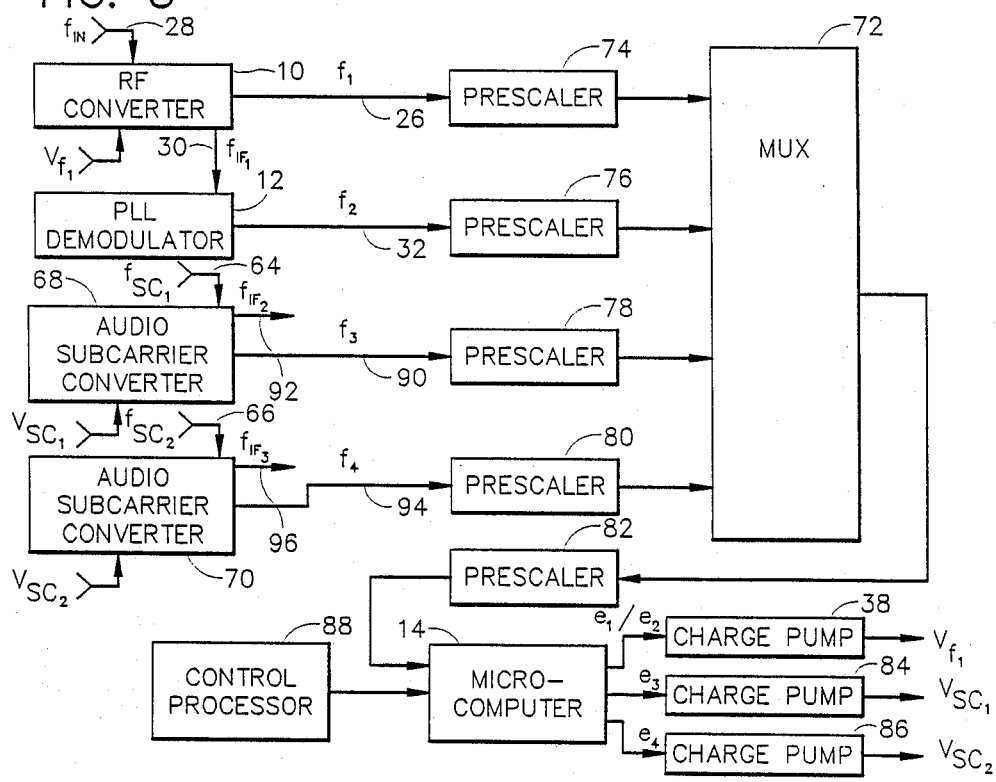
FIG. 3 is diagram illustrating the use of of the present invention for tuning both RF and audio subcarrier frequencies.

FIG. 3 shows a system for refined tuning of a selected input carrier frequency signal received on line 28 and FLL tuning of input audio subcarrier signals received on lines 64 and 66. In the system of FIG. 3, a single microcomputer 14 is used to tune the selected carrier frequency input signal and the audio subcarrier frequency input signals. The system of FIG. 3 also includes the RF converter 10, the PLL demodulator 12 and the charge pump 38 from the system of FIG. 1. The system of FIG. 3 further includes a first audio subcarrier converter 68, a second audio subcarrier converter 70, a multiplexer (MUX) 72, five prescalers 74, 76, 78, 80 and 82, two additional charge pumps 84 and 86 and a control processor 88.

The RF converter 10, the first audio subcarrier converter 68 and the second audio subcarrier converter 70 each include a VCO and a mixer, such as the VCO 16 and the mixer 18 in the RF converter 10.

In the RF converter 10, the first VCO 16 provides an output signal on line 26 at a first frequency $f_1$ that is maintained by FLL tuning at a first predetermined nominal frequency $f_n$ that is the sum or difference of a selected input carrier signal frequency $f_{IN}$ and a first predetermined intermediate frequency $f_{IF}$; and the mixer 18 mixes an RF carrier input signal on line 28 at the selected input carrier signal frequency $f_{IN}$ with the output signal on line 26 from the first VCO 16 to provide said input signal on line 30 at the predetermined intermediate frequency to the PLL demodulator 12.

In the PLL demodulator 12, the amplifier 24 amplifies and filters the input signal on line 34 at the baseband frequency $f_{BB}$ to produce a phase error signal $e_p$ on line 36 that causes the second VCO 20 to track the phase of the input signal on line 30 at the first intermediate frequency $f_{IF1}$. The second VCO 20 provides its output signal on line 32 at a second frequency $f_2$ that tracks the input signal on line 30 in response to the output signal on line 34 from the second mixer 22.

In the first audio subcarrier converter 68, the VCO provides an output signal on line 90 at a third frequency $f_3$ that is maintained by FLL tuning at a second predetermined nominal frequency that is the sum or difference of a first selected input audio subcarrier signal frequency $f_{SC1}$ and a second predetermined intermediate frequency; and the mixer mixes a first audio subcarrier input signal on line 64 at the first selected input subcarrier signal frequency $f_{SC1}$ with the output signal from the VCO to provide said input signal on line 92 at the second predetermined intermediate frequency $f_{IF2}$.

In the second audio subcarrier converter 70, the VCO provides an output signal on line 94 at a fourth frequency $f_4$ that is maintained by FLL tuning at a third predetermined nominal frequency that is the sum or difference of a second selected input audio subcarrier signal frequency $f_{SC2}$ and a third predetermined intermediate frequency; and the mixer mixes a second audio subcarrier input signal on line 66 at the second selected input subcarrier signal frequency $f_{SC2}$ with the output signal from the VCO to provide said input signal on line 96 at the third predetermined intermediate frequency $f_{IF3}$.

In the preferred embodiment, both the second predetermined intermediate frequency $f_{IF2}$ and the third predetermined intermediate frequency $f_{IF3}$ are 10.7 Mhz.

The VCO output signals on lines 26, 32, 90 and 94 at the respective frequencies of $f_1$, $f_2$, $f_3$ and $f_4$ are respectively prescaled by the prescalers 74, 76, 78 and 80 and provided to the MUX 72, which in turn provides multiplexed output signals from the VCO's of the RF converter 10, the PLL demodulator 12, the first audio subcarrier converter 68 and the second audio subcarrier 70 to the microcomputer 14 via another prescaler 82.

The microcomputer 14 measures the frequency $f_1$ of the output signal on line 26 from the first VCO 16 in the RF converter 10 and the frequency $f_2$ of the output signal on line 32 from the second VCO 20 in the PLL demodulator 12 and processes such measurements in accordance with the refined tuning algorithm of FIG. 2 discussed above to provide the first error signal $e_1$ or the second error signal $e_2$ to the charge pump 38 which in turn provides a voltage signal $V_{f1}$ for tuning the VCO 16 in the RF converter 10.

There are no standard audio subcarrier frequencies in satellite television. The subcarriers are usually located within a range of 5 MHz to 8.5 MHz. The microcomputer 14 can be programmed to tune the two audio subcarrier converters 68, 70 to any frequency within the range of 5.0 MHz to 8.5 MHz. The algorithm used for tuning the VCO's of the audio subcarrier converters 68, 70 includes the sequence of routines 40, 42 and 46 included in the refined-tuning algorithm of FIG. 2.

The microcomputer 14 measures the frequency $f_3$ of the output signal on line 90 from the VCO in the first audio subcarrier converter 68 and compares such measured frequency with the second predetermined nominal frequency (which is stored in the microcomputer 14) to provide a third error signal $e_3$ to the charge pump 84, which in turn provides a voltage signal $V_{SC1}$ for tuning the VCO in the first audio subcarrier converter 68 in response to said third error signal $e_3$ to thereby bring the frequency $f_3$ of the output signal from such VCO toward the second predetermined nominal frequency.

The microcomputer 14 measures the frequency $f_4$ of the output signal on line 94 from the VCO in the second audio subcarrier converter 70 and compares such measured frequency with the third predetermined nominal frequency (which is stored in the microcomputer 14) to provide a fourth error signal $e_4$ to the charge pump 86, which in turn provides a voltage signal $V_{SC2}$ for tuning the VCO in the second audio subcarrier converter 70 in response to said fourth error signal $e_4$ to thereby bring the frequency $f_4$ of the output signal from such VCO toward the third predetermined nominal frequency.

All the tuning is controlled by a single microcomputer which acts as a peripheral device accepting commands and predetermined frequencies and other values that are stored for comparison and decision processing from the control processor 88. Once the predetermined frequencies and the other predetermined values are loaded into the microcomputer 14, the control processor is free to do other tasks. The design is thus highly flexible and modular. Since the RF tuning algorithm provides for C-band as well as Ku-band tuning as required by the command from the control processor 88, the flexibility is further enhanced. Better modularity is also important since it helps to locate the tuning section physically away from other digital circuits.

FLL tuning, being more software oriented, results in savings in hardware. The refined tuning algorithm used in the system of the present invention saves more hardware by eliminating the need for carrier detection circuitry. Since audio subcarriers are also tuned by the same microcomputer, some of the external hardware (e.g., prescalers) can be shared which results in further cost reduction.

I claim:

1. A frequency tuning system, comprising
a first voltage-controlled oscillator (VCO) for providing an output signal at a predetermined nominal frequency that is the sum or difference of a selected input carrier frequency and a predetermined intermediate frequency;
first means for mixing an input signal at the selected input carrier frequency with the output signal from the first VCO to provide an input signal at the intermediate frequency;
a second VCO for providing an output signal at the intermediate frequency;
second means for mixing said input signal at the intermediate frequency with the output signal from the second VCO to provide an input signal at a baseband frequency;
means responsive to said input signal provided by the second mixing means for causing the second VCO to provide its output signal at the frequency of the input signal to the second mixing means;
means for measuring the frequency of the output signal from the second VCO;
means for comparing the measured frequency of the output signal from the second VCO with the predetermined intermediate frequency;
means for tuning the first VCO in response to said comparison of the measured frequency of the output signal from the second VCO with the predetermined intermediate frequency to maintain the input signal to the second mixing means at the predetermined intermediate frequency;
means for measuring the frequency of the output signal from the first VCO;
means for comparing the measured frequency of the output signal from the first VCO with the predetermined nominal frequency to provide a first error signal; and
means for tuning the first VCO in response to said comparison of the frequency of the output signal from the first VCO with the predetermined nominal frequency when said comparison provides a said first error signal that is greater than a predetermined value, to thereby bring the frequency of the output signal from the first VCO toward the predetermined nominal frequency; and wherein the means for tuning the first VCO in response to said comparison of the measured frequency of the output signal from the second VCO with the predetermined intermediate frequency includes means for enabling said tuning only when said first error signal is less than said predetermined value.

2. A system according to claim 1, wherein the means for tuning the first VCO are adapted for tuning the first VCO at a given rate in response to said comparison of the measured frequency of the output signal from the first VCO with the predetermined nominal frequency and for tuning the first VCO at a slower rate than the given rate in response to said comparison of the frequency of the output signal from the second VCO with the predetermined intermediate frequency.

3. A system according to claim 1, wherein said means for comparing the measured frequency of the output signal from the second VCO with the predetermined intermediate frequency provides a second error signal in response to said comparison; and wherein the means for tuning the first VCO in response to said comparison of the measured frequency of the output signal from the second VCO with the predetermined intermediate frequency includes means for inhibiting said tuning whenever said second error signal is greater than a second predetermined value, which represents a predetermined frequency difference between the measured frequency of the second VCO output signal and the predetermined intermediate frequency, for a given number of consecutive measurements of the frequency of the output signal from the second VCO.

4. A system according to claim 3, further comprising means for detecting that the second VCO is not responding to an output signal from the second mixing means that is derived from an input signal at the predetermined intermediate frequency;

wherein the means for tuning the first VCO in response to said comparison of the measured frequency of the output signal from the second VCO with the predetermined intermediate frequency includes means for inhibiting said tuning whenever said detecting means detect that the second VCO is not responding to an output signal from the second mixing means that is derived from an input signal at the predetermined intermediate frequency.

5. A system according to claim 4, wherein said detection means comprises means for determining whether the first error signal is greater than a third predetermined value, which represents a predetermined frequency difference between the measured frequency of the output signal from the first VCO and the predetermined nominal frequency, and is of such magnitude as to indicate that the second VCO is not responding to an output signal from the second mixing means that is derived from an input signal at the predetermined intermediate frequency.

6. A frequency tuning system, comprising a first voltage-controlled oscillator (VCO) for providing an output signal at a predetermined nominal frequency that is the sum or difference of a selected input carrier frequency and a predetermined intermediate frequency;

first means for mixing an input signal at the selected input carrier frequency with the output signal from the first VCO to provide an input signal at the intermediate frequency;

a second VCO for providing an output signal at the intermediate frequency;

second means for mixing said input signal at the intermediate frequency with the output signal from the second VCO to provide an input signal at a baseband frequency;

means responsive to said input signal provided by the second mixing means for causing the second VCO to provide its output signal at the frequency of the input signal to the second mixing means;

means for measuring the frequency of the output signal from the second VCO;

means for comparing the measured frequency of the output signal from the second VCO with the predetermined intermediate frequency;

means for tuning the first VCO in response to said comparison of the measured frequency of the output signal from the second VCO with the predetermined intermediate frequency to maintain the input signal to the second mixing means at the predetermined intermediate frequency;

wherein said means for comparing the measured frequency of the output signal from the second VCO with the predetermined intermediate frequency provides an error signal in response to said comparison; and wherein the means for tuning the first VCO in response to said comparison of the measured frequency of the output signal from the second VCO with the predetermined intermediate frequency includes means for inhibiting said tuning whenever said error signal is greater than a second predetermined value, which represents a predetermined frequency difference between the measured frequency of the second VCO output signal and the predetermined intermediate frequency, for a given number of consecutive measurements of the frequency of the output signal from the second VCO.

7. A frequency tuning system, comprising a first voltage-controlled oscillator (VCO) for providing an output signal at a predetermined nominal frequency that is the sum or difference of a selected input carrier frequency and a predetermined intermediate frequency;

first means for mixing an input signal at the selected input carrier frequency with the output signal from the first VCO to provide an input signal at the intermediate frequency;

a second VCO for providing an output signal at the intermediate frequency;

second means for mixing said input signal at the intermediate frequency with the output signal from the second VCO to provide an input signal at a baseband frequency;

means responsive to said input signal provided by the second mixing means for causing the second VCO to provide its output signal at the frequency of the input signal to the second mixing means;

means for measuring the frequency of the output signal from the second VCO;

means for comparing the measured frequency of the output signal from the second VCO with the predetermined intermediate frequency;

means for tuning the first VCO in response to said comparison of the measured frequency of the output signal from the second VCO with the predetermined intermediate frequency to maintain the input signal to the second mixing means at the predetermined intermediate frequency; and means for detecting that the second VCO is not responding to an output signal from the second mixing means that is derived from an input signal at the predetermined intermediate frequency;

wherein the means for tuning the first VCO in response to said comparison of the measured frequency of the output signal from the second VCO with the predetermined intermediate frequency includes means for inhibiting said tuning whenever said detecting means detect that the second VCO is not responding to an output signal from the second mixing means that is derived from an input signal at the predetermined intermediate frequency.

8. A system according to claim 7, further comprising means for measuring the frequency of the output signal from the first VCO;

means for comparing the measured frequency of the output signal from the first VCO with the predetermined nominal frequency to provide a first error signal; and means for tuning the first VCO in response to said comparison of the frequency of the output signal from the first VCO with the predetermined nominal frequency when said comparison provides a said first error signal that is greater than a predetermined value, to thereby bring the frequency of the output signal from the first VCO toward the predetermined nominal frequency;

wherein said detection means comprises means for determining whether the first error signal is greater than a second predetermined value, which represents a predetermined frequency difference between the measured frequency of the output signal from the first VCO and the predetermined nominal frequency, and is of such magnitude as to indicate that the second VCO is not responding to an output signal from the second mixing means that is derived from an input signal at the predetermined intermediate frequency.

9. A frequency tuning system, comprising a first voltage-controlled oscillator (VCO) for providing an output signal at a predetermined nominal frequency that is the sum or difference of a selected input carrier frequency and a predetermined intermediate frequency;

first means for mixing an input signal at the selected input carrier frequency with the output signal from the first VCO to provide an input signal at the intermediate frequency;

a second VCO for providing an output signal at the intermediate frequency;

second means for mixing said input signal at the intermediate frequency with the output signal from the second VCO to provide an input signal at a baseband frequency;

means responsive to said input signal provided by the second mixing means for causing the second VCO to provide its output signal at the frequency of the input signal to the second mixing means; and a microcomputer for performing the routines of measuring the frequency of the output signal from the second VCO;

comparing the measured frequency of the output signal from the second VCO with the predetermined intermediate frequency;

tuning the first VCO in response to said comparison of the measured frequency of the output signal from the second VCO with the predetermined intermediate frequency to maintain the input signal to the second mixing means at the predetermined intermediate frequency;

measuring the frequency of the output signal from the first VCO;

comparing the measured frequency of the output signal from the first VCO with the predetermined nominal frequency to provide a first error signal; and tuning the first VCO in response to said comparison of the frequency of the output signal from the first VCO with the predetermined nominal frequency when said comparison provides a said first error signal that is greater than a first predetermined value, to thereby bring the frequency of the output signal from the first VCO toward the predetermined nominal frequency;

wherein the microcomputer performs the routine of tuning the first VCO in response to said comparison of the measured frequency of the output signal from the second VCO with the predetermined intermediate frequency only when said first error signal is less than said predetermined value.

10. A system according to claim 9, further including a third voltage-controlled oscillator (VCO) for providing an output signal at a second predetermined nominal frequency that is the sum or difference of a selected input subcarrier frequency and a second predetermined intermediate frequency; and third means for mixing an input signal at the selected input subcarrier frequency with the output signal from the third VCO to provide an input signal at the second predetermined intermediate frequency;

wherein the microcomputer further performs the routines of measuring the frequency of the output signal from the third VCO;

comparing the measured frequency of the output signal from the third VCO with the second predetermined nominal frequency to provide a second error signal; and tuning the third VCO in response to said second error signal to thereby bring the frequency of the output signal from the third VCO toward the second predetermined nominal frequency.

* * * * *